United States Patent
Sinsheimer et al.

(10) Patent No.: US 6,888,427 B2
(45) Date of Patent: May 3, 2005

(54) FLEX-CIRCUIT-BASED HIGH SPEED TRANSMISSION LINE

(75) Inventors: Roger Sinsheimer, Petaluma, CA (US); Vladan Temer, Santa Rosa, CA (US)

(73) Assignee: Xandex, Inc., Petaluma, CA (US)

( * ) Notice: Subject to any disclaimer, the term of this patent is extended or adjusted under 35 U.S.C. 154(b) by 180 days.

(21) Appl. No.: 10/365,262

(22) Filed: Feb. 11, 2003

(65) Prior Publication Data
US 2004/0135656 A1 Jul. 15, 2004

Related U.S. Application Data

(60) Provisional application No. 60/440,074, filed on Jan. 13, 2003.

(51) Int. Cl.$^7$ ................................................. H01P 3/08
(52) U.S. Cl. ............................................................ 333/238
(58) Field of Search ............................ 333/238, 12, 84 M, 333/21 R, 33; 29/847, 868; 438/127

(56) References Cited

U.S. PATENT DOCUMENTS

| 3,518,688 A | | 6/1970 | Stayboldt et al. ............ 343/771 |
| 3,638,148 A | * | 1/1972 | Hallford et al. ............. 333/246 |
| 3,740,678 A | | 6/1973 | Hill .............................. 333/84 |
| 4,400,578 A | * | 8/1983 | Cookson et al. ........... 174/14 R |
| 4,680,423 A | * | 7/1987 | Bennett et al. ................ 174/36 |
| 5,724,012 A | | 3/1998 | Teunisse ...................... 333/238 |
| 6,590,161 B1 | * | 7/2003 | Bolouri-Saransar ......... 174/68.1 |
| 2003/0001698 A1 | * | 1/2003 | Fjelstad ....................... 333/238 |

FOREIGN PATENT DOCUMENTS

| EP | 0 343 771 | 11/1929 | ............. H01P/3/02 |
| GB | 1 275 200 | 5/1972 | ............ H01B/7/08 |

OTHER PUBLICATIONS

Ivanov et al., "Two Stage Double Layer Microstrip Spatial Amplifiers", 1995, IEEE MTT–S Digest, pp. 589–592.

Farber, A.S., "Propagating Signals Across Semiconductor Wafers", IBM Technical Disclosure Bulletin, vol. 8, No. 6, Nov. 1965, pp. 924–925.

* cited by examiner

*Primary Examiner*—Dinh T. Le
(74) *Attorney, Agent, or Firm*—Beyer Weaver & Thomas LLP (57) ABSTRACT

A transmission line circuit is described which includes a conductive plane, a plurality of signal traces, and an intermediate layer between the conductive plane and the signal traces. The intermediate layer maintains a substantially constant separation between the conductive plane and the signal traces. At least a portion of the intermediate layer comprises air. The signal traces and the conductive plane form transmission lines.

33 Claims, 7 Drawing Sheets

FLEX-CIRCUIT-BASED HIGH SPEED TRANSMISSION LINE

RELATED APPLICATION DATA

The present application claims priority from U.S. Provisional Patent Application No. 60/440,074 for FLEX-CIRCUIT-BASED HIGH SPEED TRANSMISSION LINE filed on Jan. 13, 2003, the entire disclosure of which is incorporated herein by reference for all purposes.

BACKGROUND OF THE INVENTION

The present invention relates to high speed transmission lines and, more specifically, to transmission line circuits employing flex circuits.

Figure 1A:
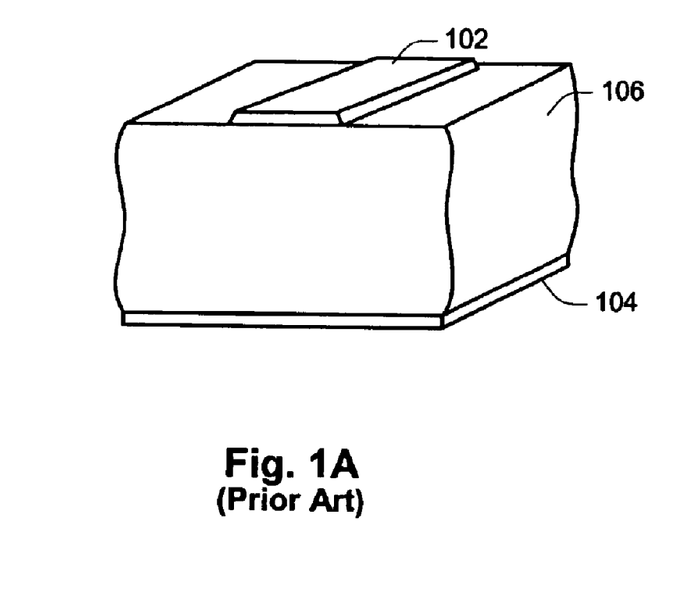
FIGS. 1A and 1B illustrate the constructions of conventional microstrip and stripline transmission lines, respectively.
Figure 1B:
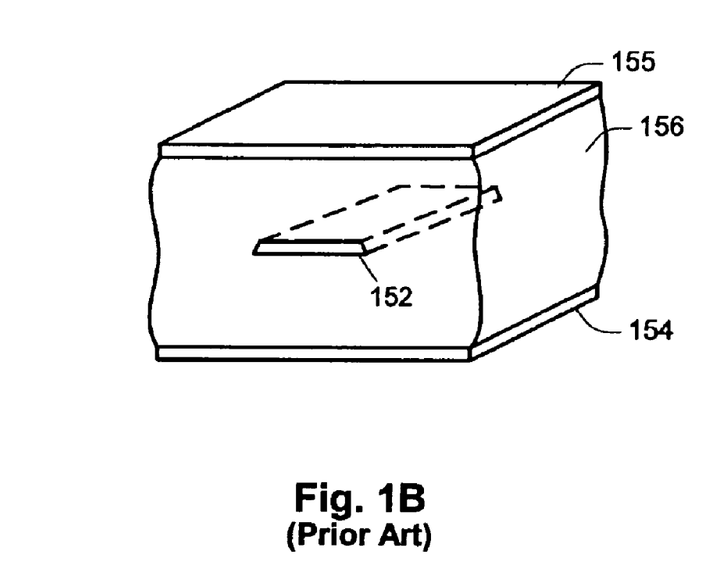

Conventional transmission line flex circuits typically employ one of two configurations, a microstrip construction shown in FIG. 1A and a stripline construction shown in FIG. 1B. In the microstrip (i.e., single-sided) construction, a signal trace 102 is separated on one side from a ground plane 104 by an intervening dielectric 106. In the stripline (i.e., double-sided) construction a signal trace 152 is separated on both sides from ground planes 154 and 155 by surrounding dielectric 156.

Significant limitations associated with such transmission line circuits relate to the nature of the dielectric material. That is, the commonly employed materials such as polyimide ($E_r$=3.5) and liquid crystal polymer or LCP ($E_r$=3.0) present a significant impediment to the propagation of wave fronts along the transmission lines due to their relatively high dielectric constants, $E_r$. As a result, conventional flex circuits have low maximum bandwidth (e.g., −3 dB @ 3 GHz for 2-inch long traces), and unacceptably high DC resistance due to the narrow trace widths possible with conventional dielectric materials. In addition, if the thickness of these dielectric materials is to be kept within a range appropriate for most applications, only very narrow traces are possible if the transmission lines are to remain within the typical 50 ohm transmission line design rules. Due to their width and high resistance, these narrow traces result in transmission lines with low current carrying capacity.

Other materials having lower dielectric constants, e.g., Teflon and Teflon-like materials, have been proposed to replace higher dielectric materials. However, these constructions have been reported to be very fragile and expensive.

It is therefore desirable to provide transmission line circuits in which the transmission lines experience a much lower dielectric constant than with conventional constructions.

SUMMARY OF THE INVENTION

According to the present invention, transmission line circuits are provided in which an intervening structure or layer is interposed between signal traces and a conductive plane and maintains a substantially constant separation between the traces and the conductive plane. At least a portion of the intervening layer or structure is air ($E_r$=1.0), resulting in a very low average dielectric constant which is experienced by the transmission lines. This, in turn, allows for the construction of a transmission line circuit with much greater performance than conventional constructions.

According to various embodiments, a transmission line circuit is provided which includes a conductive plane, a plurality of signal traces, and an intermediate layer between the conductive plane and the signal traces. The intermediate layer maintains a substantially constant separation between the conductive plane and the signal traces. At least a portion of the intermediate layer comprises air. The signal traces and the conductive plane form transmission lines.

According to a specific embodiment, a transmission line circuit is provided which includes a conductive plane and a dielectric layer adjacent the conductive plane. The dielectric layer has channels which expose the conductive plane. A substrate adjacent the dielectric layer has a plurality of signal traces thereon aligned with the channels. The dielectric layer maintains a substantially constant separation between the signal traces and the conductive plane. The signal traces and the conductive plane form transmission lines.

According to another embodiment, a transmission line circuit is provided which includes a conductive plane having a first side and a second side, a first dielectric layer adjacent the first side of the conductive plane and a second dielectric layer adjacent the second side of the conductive plane. The first dielectric layer includes first channels exposing the conductive plane, and the second dielectric layer has second channels exposing the conductive plane. A first flex circuit is bonded to the first dielectric layer and includes first signal traces aligned with the first channels. A second flex circuit is bonded to the second dielectric layer and includes second signal traces aligned with the second channels.

According to another embodiment, a transmission line circuit is provides which includes a conductive plane, a plurality of signal traces, and a foamed dielectric layer between the conductive plane and the signal traces. The foamed dielectric layer maintains a substantially constant separation between the signal traces and the conductive plane which form transmission lines.

According to another embodiment, a transmission line circuit is provided which includes a conductive plane, a plurality of signal traces, and a spacer structure between the conductive plane and the signal traces. The spacer structure maintains a substantially constant separation between the conductive plane and the signal traces, and comprises a plurality of members each having a substantially constant thickness about its longitudinal axis. The members have air therebetween. The signal traces and the conductive plane form transmission lines.

According to another embodiment, a transmission line circuit is provided which includes a conductive plane, a plurality of signal traces, and a spacer structure between the conductive plane and the signal traces which maintains a substantially constant separation therebetween. The spacer structure includes a plurality of interconnected pockets of entrapped gas. The signal traces and the conductive plane form transmission lines.

According to another embodiment, a transmission line circuit is provided which includes a conductive plane, a plurality of signal traces, and a corrugated structure between the conductive plane and the signal traces which maintains a substantially constant separation therebetween. The signal traces and the conductive plane form transmission lines.

A further understanding of the nature and advantages of the present invention may be realized by reference to the remaining portions of the specification and the drawings.

BRIEF DESCRIPTION OF THE DRAWINGS

FIGS. 2A through 7 illustrate transmission lines implemented according to various specific embodiments of the invention.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

As discussed above, the common feature of the various embodiments of the present invention is that at least a portion of the layer or structure which maintains the substantially constant separation between the signal traces and conductive (e.g., ground) plane in a transmission line circuit comprises air. According to various specific embodiments, this reduces the effective dielectric constant $E_r$ experienced by the transmission lines which may result in some or all of the following advantages. For example, a lower effective $E_r$ enables a higher velocity of propagation and reduced capacitance per linear unit of transmission line length. This, in turn, may allow for embodiments with significantly increased signal trace widths as compared to conventional structures without requiring a correspondingly large gap between the ground plane and the signal traces for a given desired impedance, e.g., 50 ohms. Such larger trace widths, in turn, allow for greater current handling capacity and reduced DC resistance per unit length of transmission line.

It should be noted at the outset that the subsequently described drawings are not rendered to scale, and that specific dimensions have been exaggerated for exemplary purposes to more clearly highlight the important aspects of the invention. Those of ordinary skill in the art will understand the appropriate dimensions for practical implementations of the described embodiments.

Figure 2A:
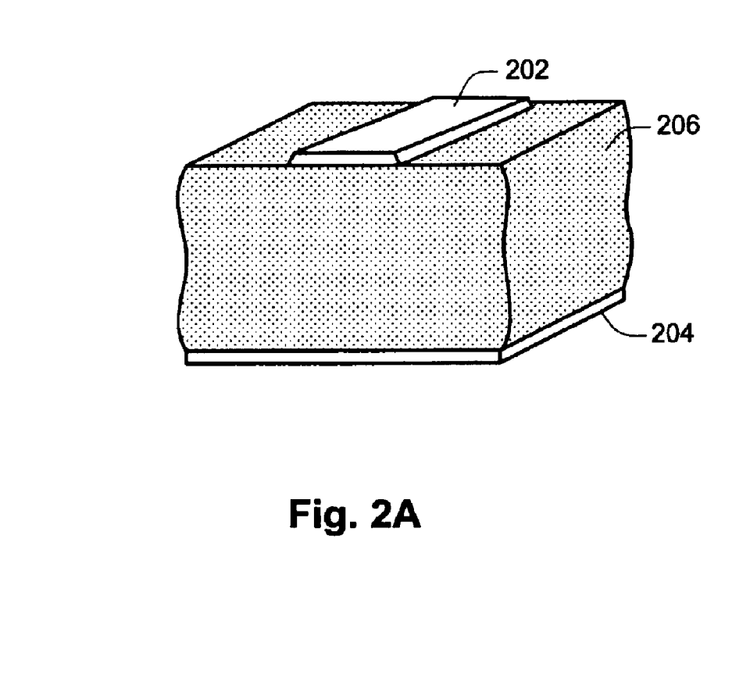
Figure 2B:
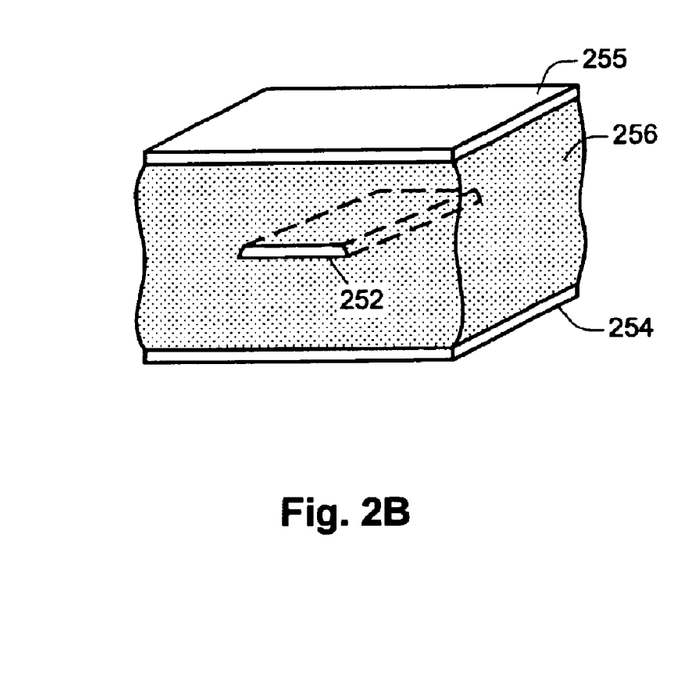

According to specific embodiments illustrated in FIGS. 2A and 2B, transmission line circuit constructions are provided which resemble the conventional single and double-sided flex circuits of FIGS. 1A and 1B. However, instead of the conventional dielectric materials employed by these previous constructions, these embodiments of the present invention employ foamed materials to maintain the separation between the signal traces and the conductive planes.

For example, in the single-sided embodiment of FIG. 2A, a signal trace 202 is separated on one side from a conductive plane 204 by an intervening foamed material 206 (as represented by dots which represent bubbles) having a relatively low dielectric constant, e.g., $E_r<2.2$. Similarly, in the double-sided embodiment of FIG. 2B, a signal trace 252 is separated on both sides from conductive planes 254 and 255 by surrounding foamed material 256 (as represented by dots which represent gas bubbles).

As used herein, the term "foamed" refers to materials into which air or some other gas or combination of gases has been introduced into the material thereby lowering its density and its dielectric constant. In general, foamed material 206 may be any flexible non-conductive material into which a gas or combination of gases has been so introduced. According to various exemplary embodiments, foamed material 206 may comprise any of a wide variety of foamed materials including, for example, foamed plastic such as foamed Teflon, silicone, acrylic, urethane, etc.

Figure 3A:
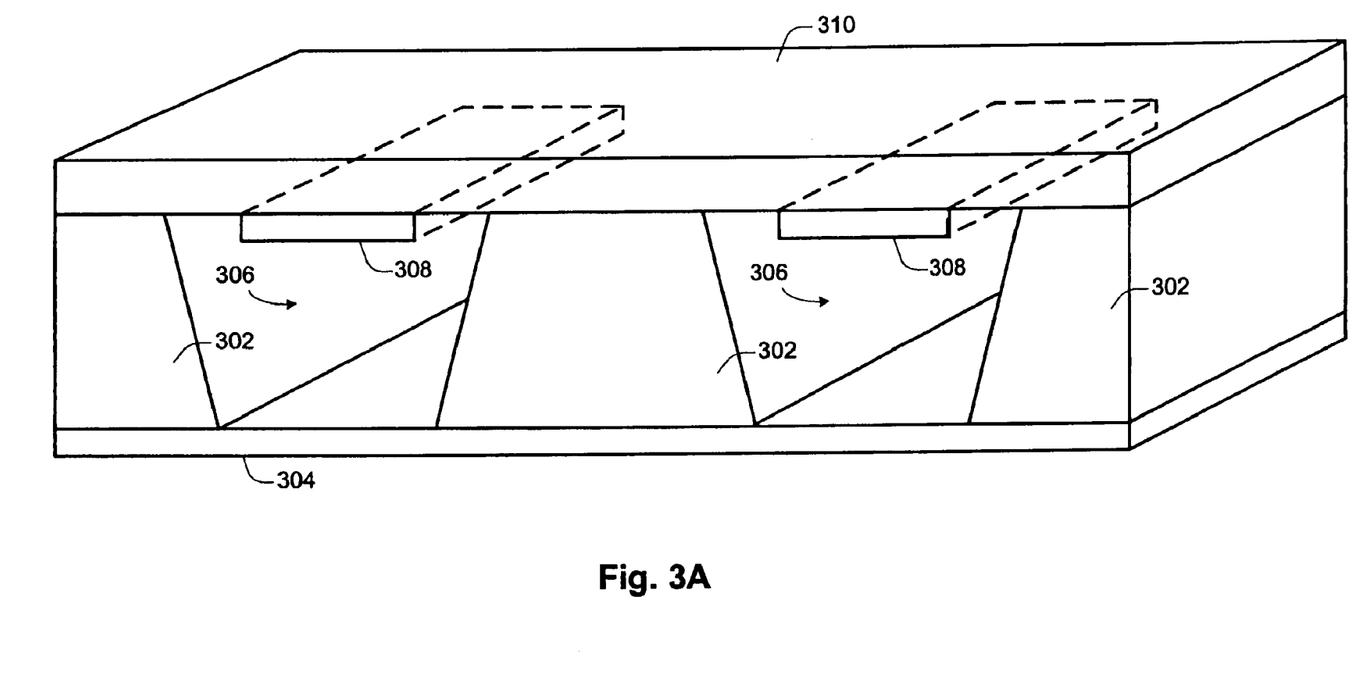

According to another embodiment of the invention shown in FIG. 3A, a transmission line circuit is provided in which a layer of material 302 is deposited on a conductive plane 304. Channels 306 are formed (e.g., by etching) in material 302 such that conductive plane 304 is exposed. Signal traces 308 are formed on a substrate 310 (e.g., by etching the desired pattern in a copper sheet bonded to the substrate) which is then bonded to material 302 such that traces 308 are aligned with channels 306. In this way, a substantially constant separation is maintained between traces 308 and conductive plane 304 by the intervening material 302 without direct contact between traces 308 and material 302 and the potentially deleterious effects associated with previous constructions.

According to various embodiments, channels 306 may be filled with air, or a low dielectric material, e.g., a foamed material. According to various embodiments, material 302 may comprises any of a wide variety of materials including, for example, the dielectric materials used in conventional constructions, e.g., polyimide or LCP, as well as foamed materials.

Figure 3B:
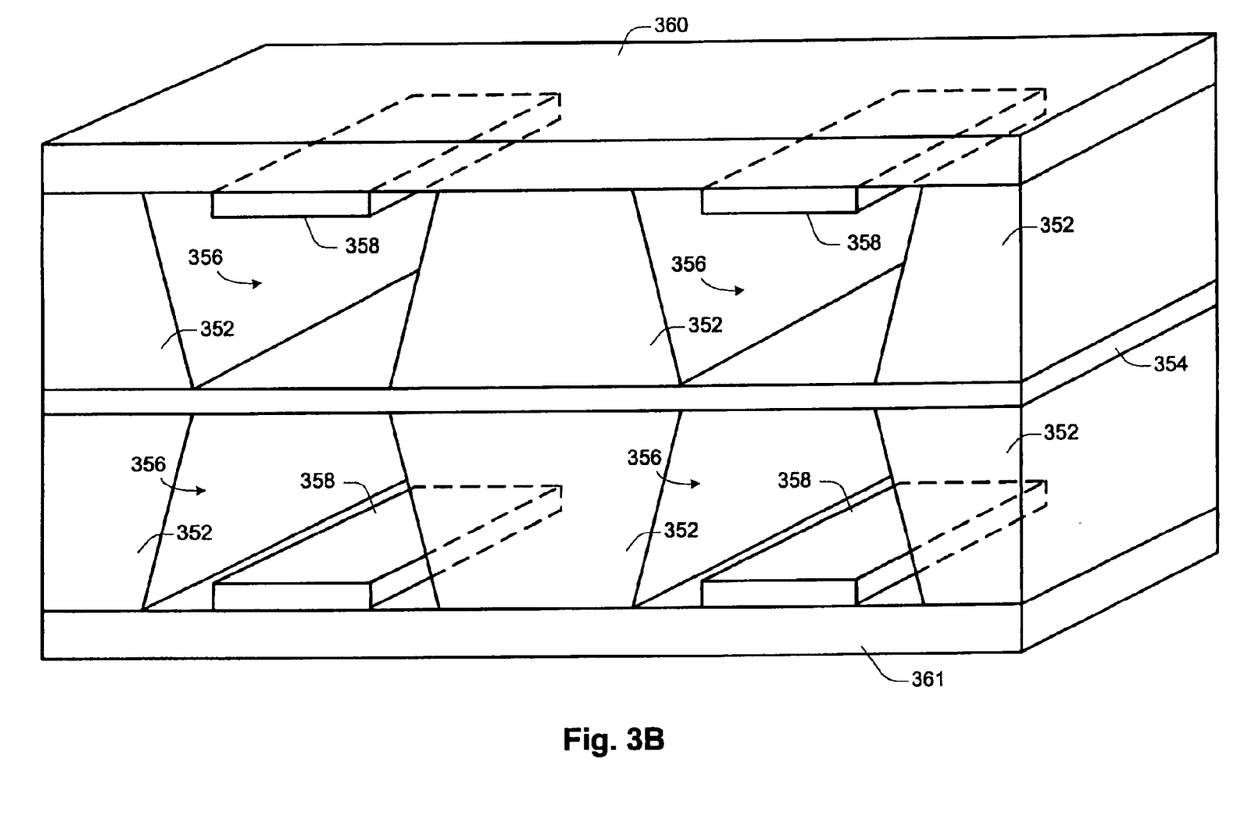

According to a more specific embodiment shown in FIG. 3B, material 352 is deposited on both sides of conductive ground plane 354 and channels 356 are formed in both layers of material 352. This enables traces 358 on substrates 360 and 361 to be bonded on both sides of conductive plane 354, thereby creating transmission lines on both sides of a shared ground plane. As with the embodiment of FIG. 3A, similar variations for material 352 and channels 356 apply. It should also be noted that this shared ground plane construction may be employed with other embodiments of the invention described below.

According to various embodiments, the substrates 310, 360 and 361 upon which the signal traces are formed may comprises a wide variety of structures and thicknesses. For example, the substrate and signal traces might form a single-sided structure such as that shown in either of FIGS. 1A and 2A. Alternatively, these substrates may comprise any suitable non-conductive material, e.g., conventional or foamed dielectrics, upon which signal traces may be formed. It should also be noted that these signal trace substrate variations may be employed with other embodiments of the invention described below.

According to various embodiments, it may be desirable to provide at least one channel in material 302 or 352 to allow entrapped air or gas to be vented from channels 306 or 356, respectively. That is, unless such venting is provided, external atmospheric pressure changes (e.g., due to altitude change) could undesirably alter the effective impedance of the transmission lines. It will be understood, however, that this may not be an issue for some applications. According to various embodiments, venting may be provided by providing one or more additional channels in the layer between the traces and the conductive plane which intersect with some or all of the trace channels.

According to additional embodiments, positive or negative pressure (e.g., using a compressor or vacuum) may be applied to any such venting port(s) for the purpose of tuning the impedance of the transmission lines to the desired value. That is, the application of such pressure would have the effect of increasing or decreasing the distance between the signal traces and the ground plane, thereby changing the effective impedance of the transmission lines formed by the combination of the two.

Figure 4A:
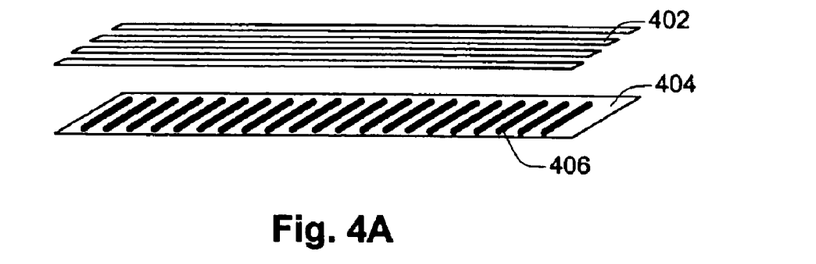

As mentioned above, according to various embodiments of the present invention, a variety of structures are contemplated which maintain the spacing between signal traces and conductive planes, and which also maintain the relatively low effective dielectric constant by enabling air or other gases to be part of that intervening layer. For example, as shown in the perspective views of FIGS. 4A–D, spacer structures comprising segments of any of a variety of materials may be interposed between signal traces 402 and conductive plane 404. FIG. 4A shows an embodiment in which multiple parallel spacing members 406 maintain the separation between traces 402 and plane 404. These spacing members, which are shown perpendicular to signal traces 402, may comprise any of a variety of non-conductive, materials including a wide variety of plastics including, for example, Teflon and Teflon-like materials. A variety of material densities may also be employed, with lower density materials (e.g., foamed or woven) being favored for correspondingly lower dielectric constants. In addition, the cross-section of spacing members 406 may comprise any of a wide variety of shapes including, circular, square, rectangular, etc. In addition, the spacing between members 406 may be varied according to the specific needs of the application to achieve the desired effective dielectric constant and mechanical properties.

Figure 4B:
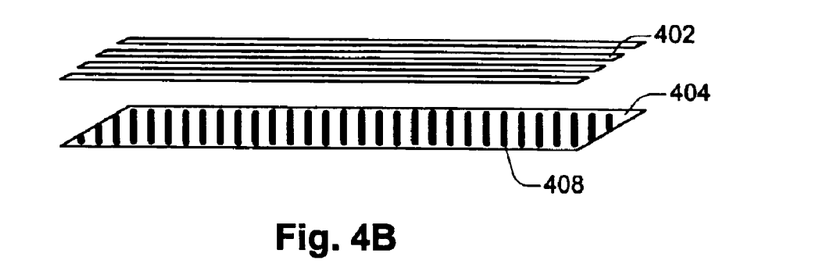
Figure 4C:
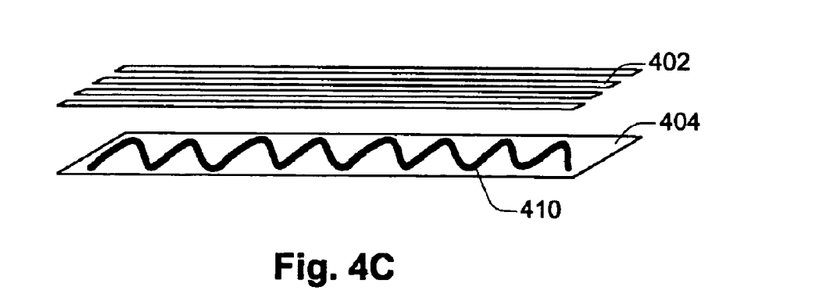
Figure 4D:
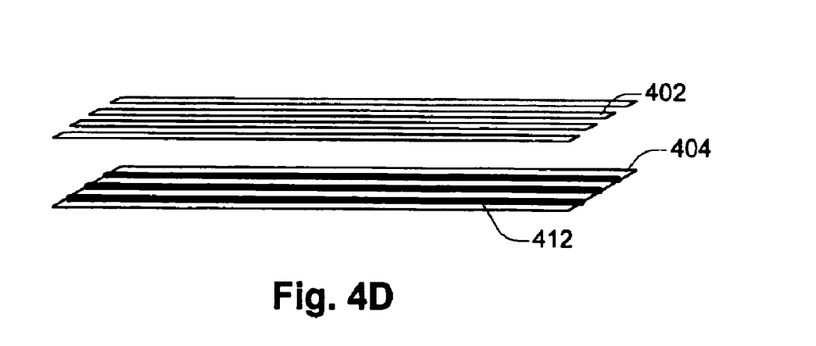

FIG. 4B shows a variation of the embodiment of FIG. 4A in which spacing members 408 are shown oriented at an angle different from 90 degrees with respect to traces 402. FIG. 4C shows a variation in which the spacing structure comprises at least one (i.e., there could be multiple such structures) continuous "string" 410 of material traversing conductive plane 404 in a serpentine manner. Such an embodiment might employ, for example, commercially available Teflon string having a consistent diameter to create such a structure. FIG. 4D shows yet another variation in which spacing members 412 are parallel with traces 402 and spaced to form channels between adjacent members 412 which are aligned with one or more traces 402. In such an embodiment, because traces 402 are aligned with the channels defined by members 412, it is the substrate on which traces 402 are deposited (not shown) which is supported by members 412. This results in a structure reminiscent of the embodiments of FIGS. 3A and 3B in which the traces are aligned with the channels formed in the intervening layer.

As mentioned above with reference to FIG. 4A, it will be understood that the embodiments of FIGS. 4A–4D are merely exemplary, and that the materials forming the various spacing structures illustrated, their orientations, cross-sections and spacings may vary considerably and still remain within the scope of the invention. According to specific ones of such embodiments in which the segments of the spacing structures cross the signal traces (e.g., the embodiments of FIGS. 4A–4C), the distance between successive spacing members is controlled to minimize reflections at these interfaces. That is, the points at which the signal traces cross over spacing structure segments are characterized by a change in dielectric coefficient (due to the material of the spacing structure) which looks like a transmission medium transition. It is well known that, unless care is taken, such transitions can result in undesirable reflections. Therefore, according to specific embodiments, the distance between successive segments of the spacing structures are determined with reference to the expected transmission frequency of the transmission lines to minimize such undesirable reflections.

Figure 5:
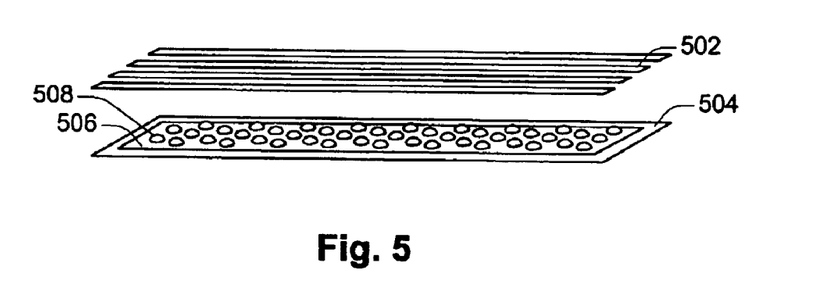

Still further spacing structures are contemplated to be within the scope of the invention. Referring to FIG. 5, a structure 506 is shown which maintains the separation between signal traces 502 and conductive plane 504. Structure 506 comprises a plurality of pockets 508 of entrapped gas which may be, for example, air, or any other gas or combination of gases. Pockets 508 may be formed by any of a variety of flexible materials, e.g., plastic. Moreover, the enclosed space in which the gas is entrapped may be completely formed by such materials or, alternatively, be formed in part by conductive plane 504, i.e., the gas would be trapped by bonding the flexible materials to the conductive plane. According to a specific embodiment, spacing structure 506 resembles (under magnification) the widely used packing material known as bubble wrap.

Figure 6A:
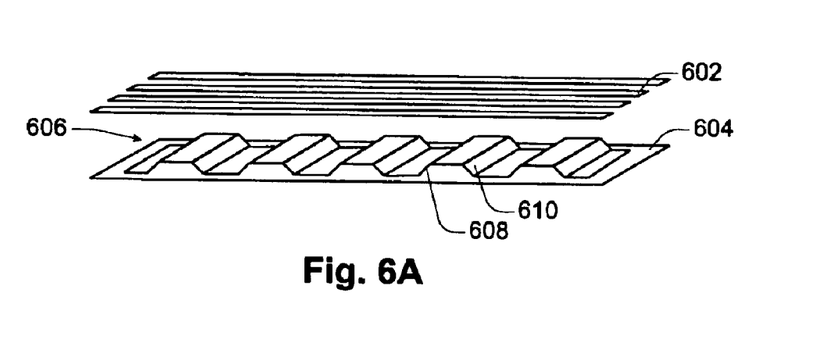

FIG. 6A shows yet another structure for use with various specific embodiments of the invention. According to such embodiments, a relatively rigid, corrugated structure 606 is interposed between signal traces 602 and conductive plane 604. Structure 606 may be formed, for example, by bending a flat sheet of material into the shape shown, or by injection molding. As will be understood, structure 606 would be quite rigid along the axis coming out of the page of the drawing, but would have some level of flexibility in the longitudinal dimension.

Figure 6B:
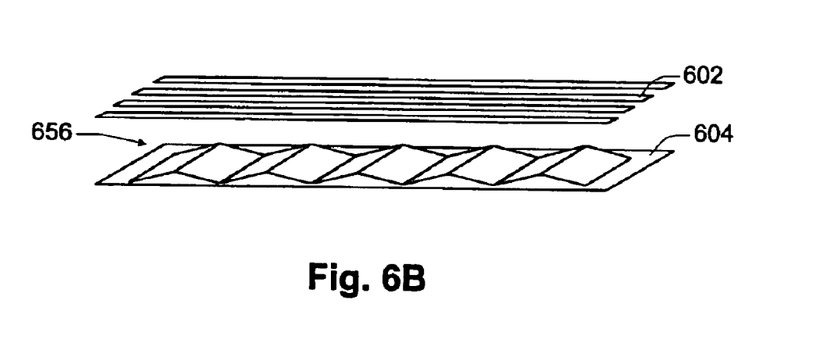

According to various more specific embodiments, the angles of the diagonal sections 608 and 610 of structure 606 are adjusted to mitigate the transition reflections occurring at the intersections of signal traces 602 and the horizontal sections of structure 606. That is, because reflections can be particularly troublesome at abrupt transitions, the angles of sections 608 and 610 can be controlled to be relatively shallow such that the change in the effective dielectric constant experienced by the transmission lines is correspondingly more gradual. According to yet another embodiment shown in FIG. 6B, a structure 656 may be formed which eliminates the horizontal sections of structure 606. In addition, the abruptness of the angles of either of corrugated structures 606 and 656 may be considerably less than those shown in the figures. That is, the angles can be replaced with curves, even to the point where the profile of the corrugated structure is a smooth curve, e.g., like a shallow sine wave.

Figure 7:
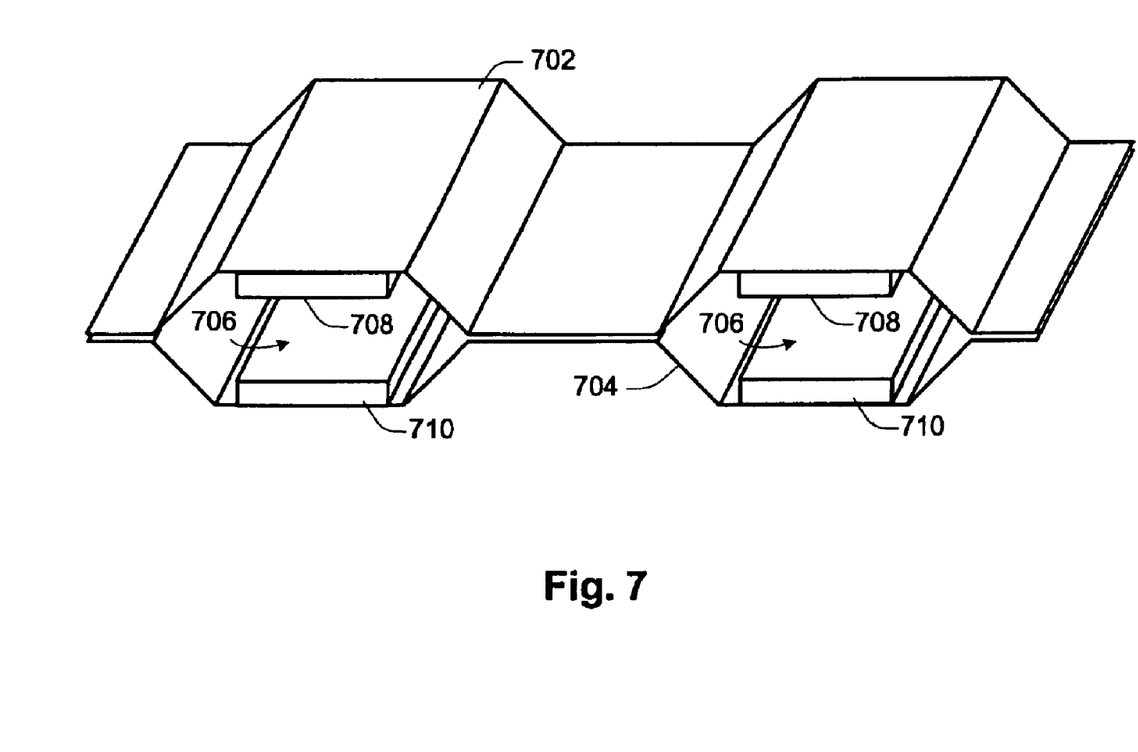

According to a further embodiment shown in FIG. 7, a structure similar to structure 606 of FIG. 6 is used in a different manner. In this embodiment, two corrugated structures 702 and 704 are stacked to form channels 706 in which pairs of traces 708 and 710 are disposed to form transmission lines. The longitudinal rigidity of the resulting structure serves the purpose of maintaining the substantially constant separation between traces 708 and 710.

As mentioned above, a generalized embodiment of the invention is one in which a substantially constant separation is maintained between signal traces and a conductive plan using an intervening spacing layer (e.g., any of the structures described above as well as equivalent structures) which comprises, at least in part, air, some other gas, or some combination of gases. In general, the effective dielectric constant of this intervening layer as experienced by the transmission lines is significantly less than if layer were completely solid. Traces may be deposited directly on the spacing layer if sufficiently solid, e.g., the embodiments of FIGS. 2A and 2B. Alternatively, traces may be deposited on a substrate which may then be coupled in any of a variety of ways to the structure of the spacing layer, e.g., the embodiments of FIGS. 3A through 6B. As described above, the nature of the relationship of the signal traces to such a substrate may vary and may comprise, for example, a single-sided transmission line constructed according to conventional techniques or various embodiments of the invention, or some other suitable substrate.

While the invention has been particularly shown and described with reference to specific embodiments thereof, it will be understood by those skilled in the art that changes in the form and details of the disclosed embodiments may be made without departing from the spirit or scope of the invention. For example, several of the embodiments described above have been described with reference to materials which are intended to enable various degrees of flexibility in the transmission line circuit. However, it should be understood that the basic principles of the present invention may also be applied to rigid constructions. That is, the intervening layer or structure which separates the signal traces and the conductive plane, or the substrate upon which the signal traces are deposited, may contribute to the transmission line circuit's rigidity rather than flexibility. In such an embodiment, for example, the intervening material might comprise phenolics, e.g., FR-4 or G10, or the structure itself might promote rigidity, e.g., a corrugated structure in which the folds or channels are parallel to the signal traces. In addition, those of ordinary skill in the art will understand the variations in, among other things, material thickness, trace width, spacing between traces and conductive planes, to create transmission lines characterized by a particular impedance, e.g., 50 ohms. Therefore, transmission lines characterized by a wide range of impedance values are contemplated to be within the scope of the invention. Moreover, the invention is not necessarily restricted to the various materials to which the described embodiments refer. For example, non-conductive materials such as polyimide, LCP, Teflon, etc., are merely provided as examples of materials which may be employed to implement various embodiments of the invention. Similarly, the conductive materials employed to implement signal traces and conductive planes may comprise any suitable conductive material appropriate for particular applications including, for example, gold, copper, aluminum, silver, etc.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A transmission line circuit, comprising:
    a conductive plane having a first side and a second side;
    a first dielectric layer adjacent the first side of the conductive plane, the first dielectric layer having first channels exposing the conductive plane;
    a second dielectric layer adjacent the second side of the conductive plane, the second dielectric layer having second channels exposing the conductive plane;
    a first substrate bonded to the first dielectric layer, the first substrate having first signal traces thereon aligned with the first channels without contacting the first dielectric layer; and
    a second substrate bonded to the second dielectric layer, the second substrate having second signal traces thereon aligned with the second channels without contacting the second dielectric layer.

2. The transmission line circuit of claim 1 wherein the first and second channels are filled with air.

3. The transmission line circuit of claim 1 wherein the first and second channels are filled with a dielectric material having a lower dielectric constant than the first and second dielectric layers.

4. The transmission line circuit of claim 3 wherein the dielectric material comprises a foamed dielectric material.

5. The transmission line circuit of claim 1 wherein the conductive plane comprises one of the group comprising copper, gold, aluminum, and silver.

6. The transmission line circuit of claim 1 wherein the first and second dielectric layers comprise one of the group comprising polyimide and liquid crystal polymer.

7. The transmission line circuit of claim 1 wherein each of the substrates forms a single-sided transmission line circuit with the conductive plane.

8. A transmission line circuit, comprising a conductive plane, and a dielectric layer adjacent the conductive plane, the dielectric layer having channels which expose the conductive plane, the circuit further comprising a substrate adjacent the dielectric layer, the substrate having a plurality of signal traces thereon aligned with and in the channels of the dielectric layer without contacting the dielectric layer, the dielectric layer maintaining a substantially constant separation between the signal traces and the conductive plane, the signal traces and the conductive plane forming transmission lines.

9. The transmission line circuit of claim 8 wherein the conductive plane, the dielectric layer, the substrate and the signal traces form a flexible structure.

10. The transmission line circuit of claim 8 wherein the conductive plane, the dielectric layer, the substrate and the signal traces form a rigid structure.

11. The transmission line circuit of claim 8 wherein the channels are filled with at least one gas.

12. The transmission line circuit of claim 11 wherein the at least one gas comprises air.

13. The transmission line circuit of claim 8 wherein the channels are filled with a dielectric material having a lower dielectric constant than the dielectric layer.

14. The transmission line circuit of claim 13 wherein the dielectric material comprises a foamed dielectric material.

15. The transmission line circuit of claim 8 wherein the dielectric layer comprises a foamed dielectric material.

16. The transmission line circuit of claim 8 wherein the conductive plane comprises one of the group comprising copper, gold, aluminum, and silver.

17. The transmission line circuit of claim 8 wherein the dielectric layer comprises one of the group comprising polyimide and liquid crystal polymer.

18. The transmission line circuit of claim 8 wherein the substrate comprises a second conductive plane, the substrate and the signal traces forming a single-sided transmission line circuit.

19. The transmission line circuit of claim 8 wherein the channels are formed by etching the dielectric layer.

20. The transmission line circuit of claim 8 wherein the substrate is bonded to the dielectric layer.

21. The transmission line circuit of claim 8 further comprising a second dielectric layer adjacent an opposing side of the conductive plane from the dielectric layer, the second dielectric layer having second channels which expose the conductive plane, the circuit further comprising a second substrate adjacent the second dielectric layer, the second substrate having a second plurality of signal traces thereon aligned with the second channels, the second dielectric layer maintaining a substantially constant separation between the second signal traces and the conductive plane, the second signal traces and the conductive plane forming second transmission lines.

22. The transmission line circuit of claim 8 wherein the dielectric layer has at least one additional channel intersecting the channels to allow venting of air from the channels.

23. The transmission line circuit of claim 22 wherein effective impedances associated with the transmission lines are tuned by application of positive or negative pressure via the at least one additional channel.

24. A transmission line circuit, comprising a conductive plane, a plurality of signal traces, and an intermediate layer between the conductive plane and the signal traces and maintaining a substantially constant separation therebetween, at least a portion of the intermediate layer comprising air, the signal traces and the conductive plane forming transmission lines, wherein the intermediate layer comprises a spacer structure, the spacer structure comprising one of a plurality of members having air therebetween, a plurality of interconnected pockets of entrapped gas, and a corrugated structure.

25. A transmission line circuit, comprising a conductive plane, a plurality of signal traces, and a spacer structure between the conductive plane and the signal traces and maintaining a substantially constant separation therebetween, the spacer structure comprising a plurality of members each having a substantially constant thickness about its longitudinal axis , the members having air therebetween , the signal traces and the conductive plane forming transmission lines, wherein the members form a continuous serpenting structure.

26. The transmission line circuit of claim 25 wherein the continuous serpentine structure comprises a string of material.

27. The transmission line circuit of claim 26 wherein the material comprises one of the group comprising Teflon and nylon.

28. A transmission line circuit, comprising a conductive plane, a plurality of signal traces, and a corrugated structure between the conductive plane and the signal traces and maintaining a substantially constant separation therebetween, the signal traces and the conductive plane forming transmission lines.

29. The transmission line circuit of claim 28 wherein the corrugated structure comprises first substantially flat portions and second substantially flat portions interconnected by connecting portions, the first and second portions being parallel and in contact with the signal traces and the conductive plane, respectively.

30. The transmission line circuit of claim 29 wherein an angle at which the connecting portions connect with the first and second portions is controlled to mitigate dielectric constant transitions where the signal traces and the conductive plane are in close proximity to the first and second portions, respectively.

31. The transmission line circuit of claim 28 wherein the corrugated structure comprises first substantially flat portions and second substantially flat portions interconnected at a plurality of bends, the signal traces and the conductive plan being in contact with the corrugated structure at the plurality of bends.

32. The transmission line circuit of claim 31 wherein the plurality of bends comprise one of obtuse, acute, and 90 degree angles.

33. The transmission line circuit of claim 31 wherein the bends comprise rounded transitions between the first and second portions.

* * * * *